United States Patent [19]

Troudet et al.

[11] Patent Number: 4,855,683

[45] Date of Patent: Aug. 8, 1989

[54] DIGITAL PHASE LOCKED LOOP WITH BOUNDED JITTER

[75] Inventors: Thierry Troudet, Old Bridge Township, Middlesex County; Stephen M. Walters, Holmdel Township, Monmouth County, both of N.J.

[73] Assignee: Bell Communications Research, Inc., Livingston, N.J.

[21] Appl. No.: 120,994

[22] Filed: Nov. 18, 1987

[51] Int. Cl.$^4$ .......................... H03L 7/00; H03K 5/00
[52] U.S. Cl. .................... 328/155; 331/1 A; 331/11; 331/25; 328/133; 377/118; 307/511; 307/529
[58] Field of Search ................. 328/133, 134, 155, 55, 328/63; 307/510, 511, 527; 331/11, 1 A, 25; 375/118, 120; 377/47

[56] References Cited

U.S. PATENT DOCUMENTS

| 3,023,370 | 1/1962 | Waller | 331/11 |
|---|---|---|---|
| 3,375,448 | 3/1968 | Newman et al. | 331/1 A |
| 3,401,353 | 9/1968 | Hughes | 331/11 |
| 3,458,823 | 7/1969 | Nordahl | 328/155 |
| 3,611,175 | 10/1971 | Boelke | 331/1 A |
| 3,633,115 | 1/1972 | Epstein | 328/63 |
| 3,646,452 | 2/1971 | Horowitz et al. | 307/511 |
| 3,693,099 | 9/1972 | Oberst | 328/134 |
| 3,710,274 | 1/1973 | Basse et al. | 331/1 A |
| 3,778,723 | 12/1973 | Schaefer | 328/155 |
| 4,037,171 | 7/1977 | Cordell | 331/14 |
| 4,206,425 | 6/1980 | Nossen | 332/19 |
| 4,280,099 | 7/1981 | Rattlingourd | 328/63 |
| 4,290,022 | 9/1981 | Puckette | 328/55 |
| 4,374,438 | 2/1983 | Crowley | 455/265 |
| 4,380,742 | 4/1983 | Hart | 331/1 A |
| 4,380,743 | 4/1983 | Underhill et al. | 331/1 A |
| 4,423,390 | 12/1983 | Waters | 331/11 |
| 4,511,859 | 4/1985 | Dombrowski | 331/11 |
| 4,528,521 | 7/1985 | Grimes | 331/1 A |
| 4,565,975 | 1/1986 | Gegner et al. | 331/1 A |
| 4,577,163 | 3/1986 | Culp | 328/155 |
| 4,577,613 | 3/1986 | Culp | 328/155 |
| 4,590,602 | 5/1986 | Wolaver | 331/1 A |
| 4,612,516 | 9/1986 | Defeuilley et al. | 331/11 |
| 4,791,378 | 12/1988 | Waltham | 328/155 |

FOREIGN PATENT DOCUMENTS

| 0199448 | 10/1986 | European Pat. Off. | |
| 0124662 | 9/1979 | Japan | 328/155 |
| 2122822 | 1/1984 | United Kingdom | |

OTHER PUBLICATIONS

Rae et al–"Variable Frequency Oscillator Using a Frequency Discriminator"–IBM Technical Disclosure Bulletin–vol. 27–No. 1A–Jun. 1984–pp. 355–357.

Primary Examiner—John S. Heyman
Assistant Examiner—Tai V. Duong
Attorney, Agent, or Firm—James W. Falk; Stephen M. Gurey

[57] ABSTRACT

A digital phase locked loop operable over a wide dynamic range has jitter performance that is exactly bounded within predetermined limits. The phase locked loop includes an accumulator-type digital voltage controlled oscillator (201) which generates from a high speed system clock, an output clock signal at frequency equal to p times the frequency of an input clock signal, and which output frequency is controlled by the value k of a digital input to the VCO. A frequency window comparator (208) compares the number of output clock pulses between input clock pulses to determine, based on the count, whether the frequency of the output is too high, too low or equal to the correct frequency. A phase window comparator (210) simultaneously determines from the phase of the output clock signal whether the phase is leading, lagging or within a prescribed window of acceptability. In response to these determinations, k-controller (217) increases k to increase the frequency of the VCO when the frequency window comparator indicates the frequency is low or the phase window comparator indicates the phase is lagging; alternatively, k is decreased when the frequency is high or the phase is leading. Adjustment continues until the output clock is at the proper frequency and phase of the output clock falls within the window of acceptability.

17 Claims, 7 Drawing Sheets

DIGITAL PHASE LOCKED LOOP WITH BOUNDED JITTER

BACKGROUND OF THE INVENTION

This invention relates to phase locked loops, and more particularly to phase locked loops operable over a wide dynamic range and having a jitter performance bounded within predetermined limits.

In digital communications, generation of higher rate clock signals from lower rate signals is required frequently. Such clock signals generally need to be generated over wide dynamic ranges of frequency and must be as jitter-free as possible in order to ensure proper data transmission, clock recovery, and synchronization. Digital phase locked loops are most often used to generate stable higher rate clock signals from lower rate clocks. In a digital phase locked loop (DPLL) a digital voltage controlled oscillator (DVCO) fabricates from a very high speed system clock, an output clock signal having a frequency determined by an input control signal. This control signal is derived by comparing the frequency/phase of the input clock and a feedback signal equal to the DVCO output clock divided in frequency by an integer p. By the nature of the feedback loop, the frequency of the output of the DVCO is driven to p times the frequency of the input clock thereby imparting the desired frequency multiplication to the input clock. Disadvantageously, the frequency of the the DVCO will discretely jiggle above and below the desired frequency as repeated comparisons determine that the DVCO frequency needs to be increased or decreased to synchronize the input and feedback signals. The output of the DVCO will thus be a signal that characteristically presents some jitter with respect to an ideal signal operating at the same frequency. Prior art digital phase locked loops which maintain the jitter at a low level generally required complicated implementations. While such implementations have low jitter performance, it is bounded only in a statistical sense. In addition, these prior art phase locked loops have had a limited dynamic range of frequencies over which the circuit would have the desired low jitter performance.

A simple phase locked loop operable over a wide dynamic range of frequencies and which has pre-imposed jitter requirements is therefore desirable for the many digital applications in which a stable clock signal is needed.

SUMMARY OF THE INVENTION

The phase locked loop of the present invention has a jitter performance which is known a priori to be below a predetermined value. Furthermore, the phase locked loop is operable over a wide range of frequencies which are also determined by the parameters of the circuit. In accordance with the invention, the feedback loop includes both a frequency window comparator and a phase window comparator which together are used to generate control signals for the voltage controlled oscillator that generates the clock signal at the desired output frequency. In particular, the frequency window comparator determines whether the frequency of the voltage controlled oscillator is too slow, too fast, or at the proper frequency; and the phase window comparator determines whether the phase of the VCO is leading its idealized output, lagging its idealized output, or within predetermined phase bounds of its idealized output. In accordance with the frequency and phase window comparisons, the frequency of the VCO is adjusted up, down or held constant.

The embodiment of the invention described herein is an all-digital phase locked loop which incorporates an accumulator-type VCO to synthesize from a very high frequency, $f_s$, system clock, the desired output clock signal having a frequency, $f_{VCO}$, equal to p times the frequency of the input clock, $f_{ref}$. The VCO includes a digital adder, an input k-register and a latch/phase-register, the latter of which generates the output clock at a frequency that is determined by the value k, and at a phase that is represented at each input clock pulse by the value in the latch/phase-register. The frequency window comparator consists of a counter which counts the number of output clock pulses, $f_{VCO}$, occurring between each input clock pulse, $f_{ref}$, which when the VCO is operating at the proper frequency, equals p. The number of pulses counted between each input clock pulse is therefore indicative of whether the output clock is too fast, too slow, or at the desired frequency. Similarly, at each input clock pulse, the phase window comparator examines the phase-register and determines from the value stored therein whether the oscillator is leading, lagging or within the prescribed phase window. If a comparison indicates that the number of pulses counted is less than p, then the output frequency is too slow and the k-register in the DVCO is incremented. If a comparison indicates that the the number of pulses counted is greater than p, then the output frequency is too fast and the k-register is decremented. When frequency lock is reached, phase comparisons continue and k is "fine-tuned" until the output signal is within the prescribed phase window.

DETAILED DESCRIPTION

Figure 1:
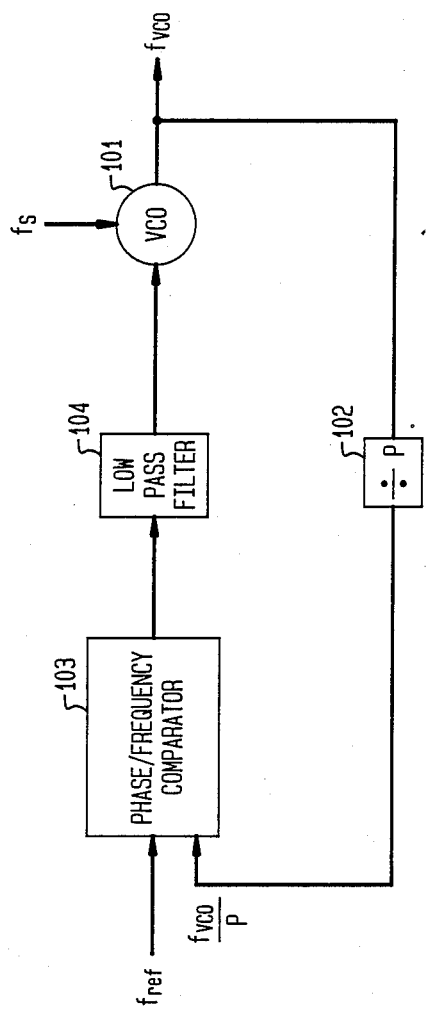
FIG. 1 is a block diagram of a prior art digital phase locked loop.

With reference to the block diagram of the prior art digital phase locked loop of FIG. 1, digital voltage controlled oscillator 101 synthesizes an output clock at frequency $f_{VCO}$ from a high frequency system clock at frequency $f_s$, in response to a control error signal. The error signal is derived by comparing in frequency and phase the input clock signal at frequency $f_{ref}$ with the output clock signal after the latter has been divided in frequency by divide-by-p circuit 102. Phase/frequency comparator 103 compares the two signals to produce an error signal which, when filtered by low pass filter 104, controls the frequency of VCO 101 so as to reduce the error. At lock, the inputs of phase/frequency comparator 103 converge so that:

$$f_{VCO} = p f_{ref} \tag{1}$$

As the frequency of the VCO is adjusted up and down in response to its input signal, the pulse edges of the output signal will jitter from the corresponding edges of an ideal signal exactly having the desired frequency, $p f_{ref}$. Such jitter, defined as the maximum deviation (expressed in time or a fraction of a pulse) of a pulse edge from the ideal signal at $p f_{ref}$, will accumulate, perhaps reaching 100% or equivalently one pulse discrepancy, causing synchronization and error problems associated with data transmission.

Figure 2:
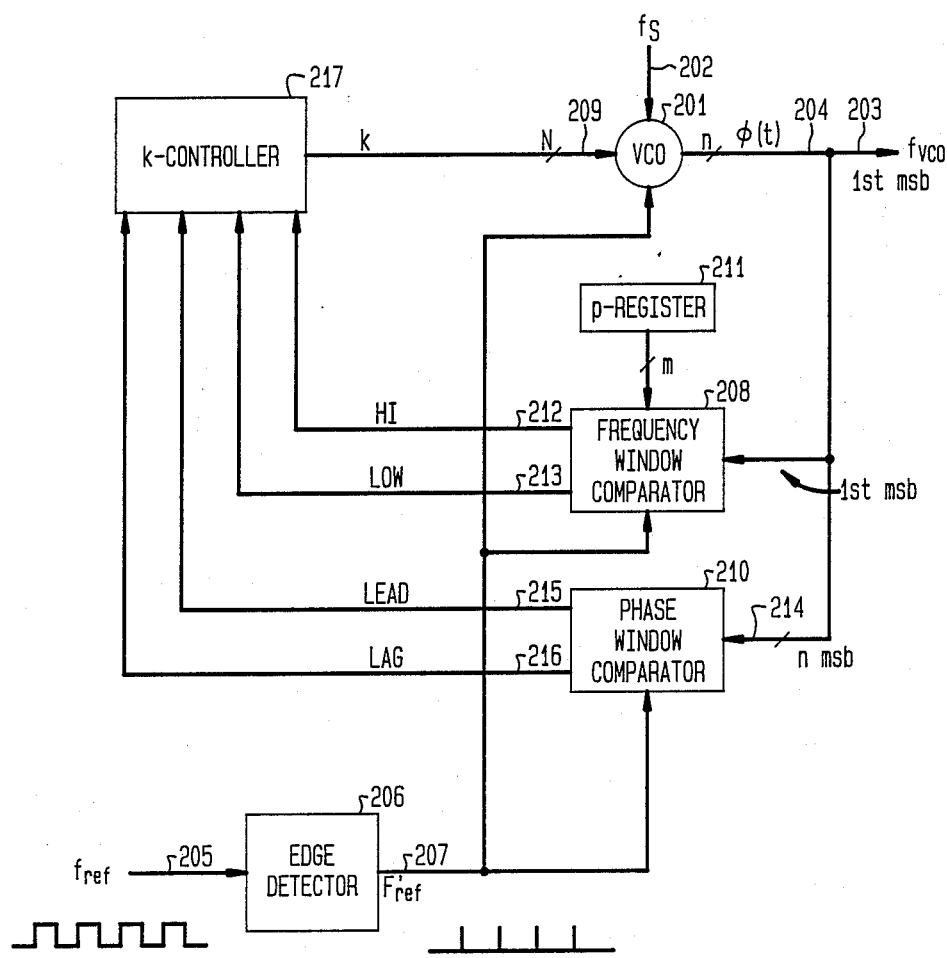
FIG. 2 is a block diagram of the digital phase locked loop in accordance with the present invention.

With reference to FIG. 2, the phase locked loop of the present invention produces an output clock signal at frequency $f_{VCO}$, equal to $p f_{ref}$, in which the jitter is bounded within prescribed limits. An accumulator-type digital voltage controlled oscillator (VCO) 201, to be described in detail hereinafter, synthesizes the output clock at frequency $f_{VCO}$ from high speed input clock on lead 202 at frequency $f_s$, and in response to a train of short pulses which are synchronized with the leading edges of the input clock by means of edge detector 206. This pulse train, designated $F_{ref}'$, therefore has the same frequency, $f_{ref}$, as the input clock signal on lead 205. As will be described, the frequency $f_{VCO}$ of VCO 201 is directly controllable by means of the input k on leads 209.

In connection with the description of VCO 201 in FIG. 3 hereinafter, the frequency of VCO 201 will be shown to be a function of $f_{ref}$, the number of bit positions N in a latch within the VCO, and the value of input k on N parallel leads 209. VCO 201 includes the aforenoted N-bit latch/phase-register, the stored digital value of which at each instant represents the phase of the output clock signal. The output clock signal itself will be noted as being the signal created from the time varying ONEs and ZEROes in the first most significant bit (msb) position of the latch/phase-register. Accordingly, the output clock at $f_{VCO}$, is shown on lead 203 as the first msb output lead of the N-bit output, $\phi(t)$, on output leads 204 of VCO 201.

To be described hereinafter, each pulse of signal $F_{ref}'$, which as aforenoted is coincident with the rising edge of each input clock pulse, resets VCO 201, and triggers a comparison by frequency window comparator 208 and phase window comparator 210. Input to frequency window comparator 208 is the output clock at $f_{VCO}$ on the first msb output lead of VCO 201 and p as stored in p-register 211. Frequency window comparator 208, in effect, divides the frequency $f_{VCO}$ by a factor of p and determines whether $(f_{VCO})/p$ is higher, lower or equal to the ideal frequency. Specifically, frequency window comparator 208 counts the number of $f_{VCO}$ pulses between each $F_{ref}'$ pulse. If the frequency of VCO 201 is properly set, then exactly p pulses are counted. If, however, the frequency $f_{VCO}$ is too fast, then more than p pulses are counted and a pulse is generated by frequency window comparator 208 on HI output 212. Similarly, if $f_{VCO}$ is too slow, then less than p pulses are counted and a pulse is generated on LOW output 213. When exactly p pulses are counted, no pulse is generated on either the HI or the LOW outputs.

A phase comparison is made in response to each pulse. Specifically, in response to each $F_{ref}'$ pulse, a quantized version of the N-bit phase output of VCO 201, $\phi(t)$, represented by the n most significant bits of $\phi(t)$ on n-parallel leads 214, is examined by phase window comparator 210. The parameters n and N will be noted to determine the maximum jitter of the output clock, $f_{VCO}$. If the phase represented on leads 214 is within a prescribed window then no pulse is produced on either output leads 215 or 216. If, however, the phase indicated on leads 214 is leading the phase of the idealized signal, then a pulse is produced on the LEAD output 215. Similarly, if the phase indicated on leads 214 is lagging the phase of the idealized signal, then a LAG pulse is produced on the LAG output 216.

As will be described in connection with FIG. 8A, k-controller 217 generates a new value of k on leads 209 to either increase or decrease $f_{VCO}$ in response to a LOW or HI output pulse, respectively, from frequency window comparator 208. Adjustment of $f_{VCO}$ through k continues until a pulse on neither the HI or LOW outputs is generated by frequency window comparator 208, whereupon pulses on the LEAD and LAG outputs of phase window comparator 210 "fine tune" k, and thus $f_{VCO}$, until a pulse on neither output 215 nor 216 is generated. When such a stable condition is reached, the frequency of VCO 201 has reached its idealized value and the jitter of the output clock signal is assured to be within prescribed limits. As aforenoted, and as will be detailed hereinafter, these limits are determined by the n and N.

Figure 3:
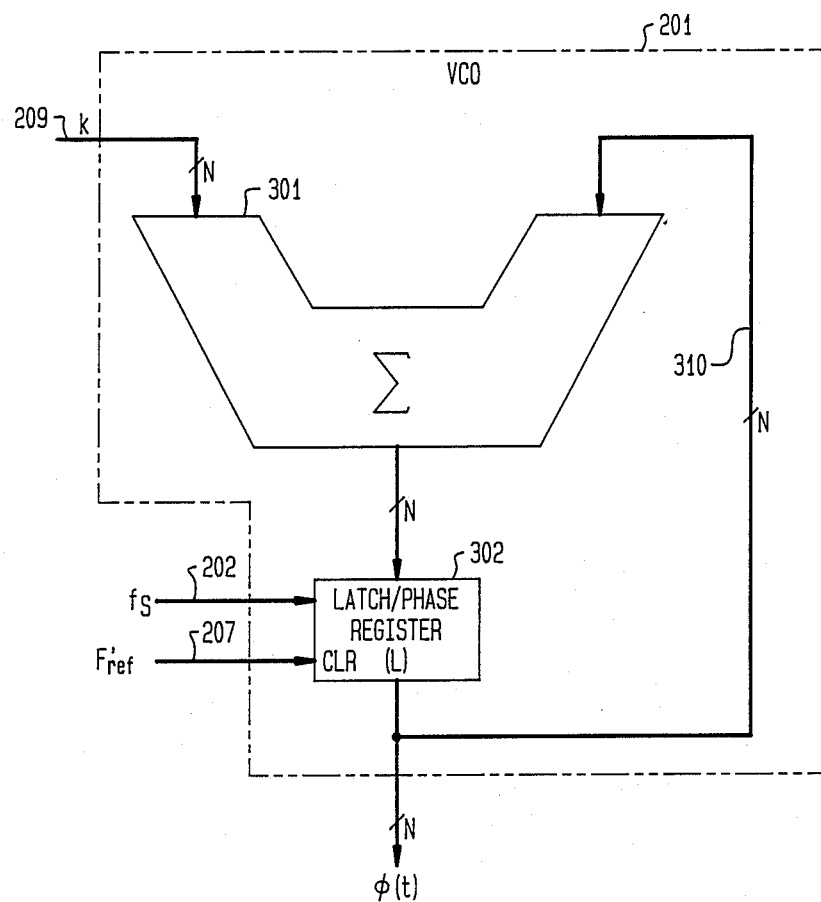
FIG. 3 is a diagram of the accumulator-type voltage controlled oscillator employed in the phase locked loop of FIG. 2.

A block diagram of digital VCO 201 is shown in FIG. 3. Similar numerical designations are given for those elements common to FIGS. 2 and 3, and in all FIGURES described hereinafter. As aforenoted, VCO 201 is an accumulator-type VCO in which the VCO output is generated by successively adding the value of an integer k to itself at the high frequency rate, $f_s$, of a system clock input. The VCO includes a digital adder 301 having as one input on leads 209 an N-bit representation of k. In response to the rising edge of each system clock pulse on lead 202, the value in adder 301 is latched through latch 302 on lead 310 to a second input of adder 301 and added to k. Latch 302 is cleared in response to each $F_{ref}'$ pulse on lead 207. Therefore, after the nth system clock pulse following an $F_{ref}'$ pulse, the value in latch 302, L, is equal to $(n \times k)$ modulo $(2^N)$. The VCO output is given by the most significant bit (msb) of the output of the latch, so that the VCO output frequency is given by the formula:

$$f_{vco} = \frac{k}{2^N} f_s \tag{2}$$

The N-bit value stored in latch 302 at each instant of time, L, also represents the phase $\phi(t)$ of the VCO output signal in accordance with the following formula:

$$\phi(t) = \frac{L}{2^N} \times 360° \tag{3}$$

Therefore, latch 302 serves as a phase-register from which the phase of the VCO output can be determined. From equation (2), it can be noted that a large set of discrete frequencies can be generated exactly by this type of accumulator-type VCO.

Figure 4:
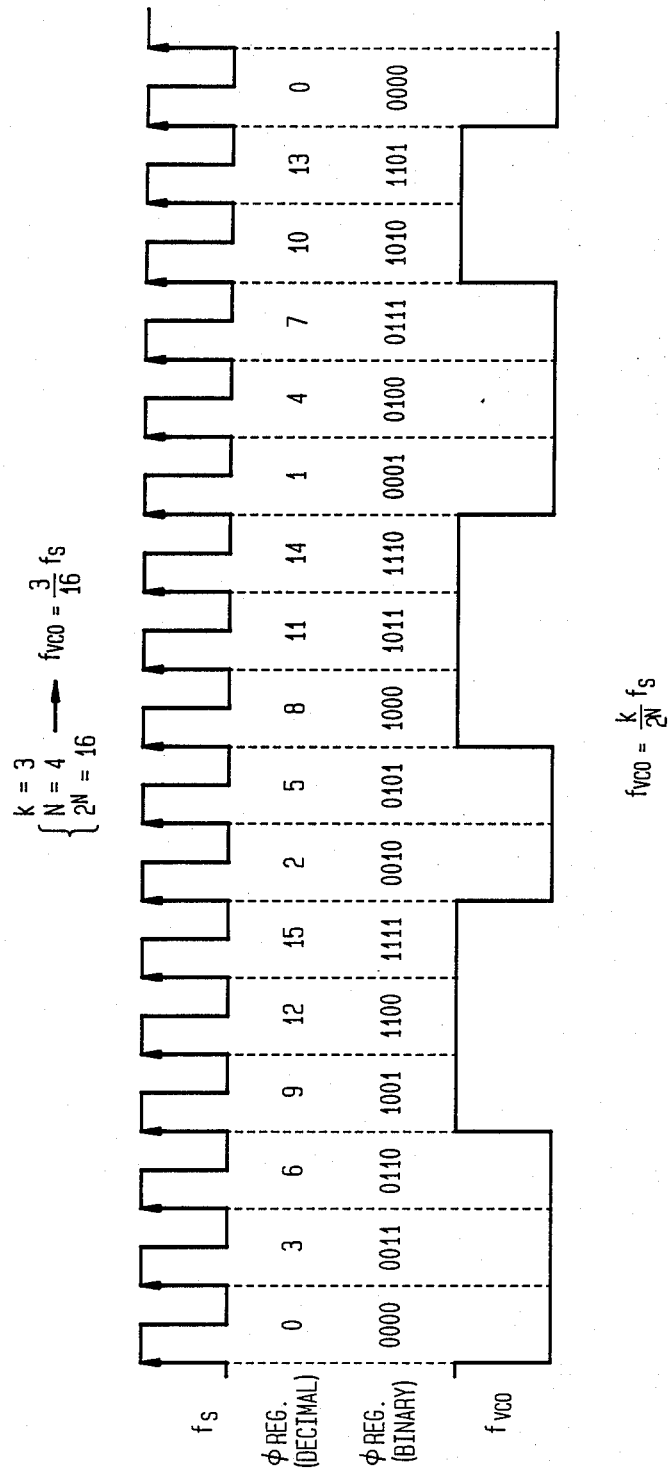
FIG. 4 is a timing diagram showing the output of the VCO of FIG. 3 for a particular numerical example.

As a numerical example, for a 4-bit adder with k=3, Table 1 shows for all 16 possible values of L, the digital and decimal values stored in the phase-register, the msb of the phase-register, and the phase in degrees of the VCO output signal. FIG. 4 graphically shows the VCO output for the 16 $f_s$ pulses that comprise one cycle of the phase-register for N=4. As can be noted from Table 1 and FIG. 4, there are three rising edges in the VCO output during the 16 $f_s$ pulse cycle so that for this example the frequency of the VCO is given by:

$$f_{vco} = \frac{3}{16} f_s \quad (4)$$

thereby verifying equation (2) for N=4 and k=3.

TABLE 1

| $f_s$ pulse # | Phase Register (Decimal) | Phase-Register (Binary) | msb | Phase (Degrees) |
|---|---|---|---|---|
| 0 | 0 | 0000 | 0 | 0 |
| 1 | 3 | 0011 | 0 | 67.5 |
| 2 | 6 | 0110 | 0 | 135 |
| 3 | 9 | 1001 | 1 | 202.5 |
| 4 | 12 | 1100 | 1 | 270 |
| 5 | 15 | 1111 | 1 | 337.5 |
| 6 | 2 | 0010 | 0 | 45 |
| 7 | 5 | 0101 | 0 | 112.5 |
| 8 | 8 | 1000 | 1 | 180 |
| 9 | 11 | 1011 | 1 | 247.5 |
| 10 | 14 | 1110 | 1 | 315 |
| 11 | 1 | 0001 | 0 | 22.5 |
| 12 | 4 | 0100 | 0 | 90 |
| 13 | 7 | 0111 | 0 | 157.5 |
| 14 | 10 | 1010 | 1 | 225 |
| 15 | 13 | 1101 | 1 | 292.5 |

In the practical range of applications of the VCO, $f_{VCO} < < f_s$ so that the VCO itself produces in the generated signal an intrinsic jitter ($f_{VCO}$)/$f_s$ much smaller than 1 which is equivalent to a quantization error (noise) due to sampling the ideal waveform at $f_s$.

In order to generate the desired VCO frequency, $f_{VCO}$, at $pf_{ref}$, latch 302 is reset in response to each $F_{ref}'$ pulse on lead 207. In addition, as already aforenoted, the VCO is operated in conjunction with frequency window comparator 208 and k-controller 217 (in FIG. 2) to search for a value of k that leads to exactly p pulses of the VCO output between each $F_{ref}'$ pulse. For given values of $f_{ref}$ and $f_s$, it is possible to find at least one integer k which leads to less than (p+½) and more than (p−½) VCO clock periods during a single cycle of the $F_{ref}'$ pulse stream, if the number of bits, N, of accumulator 301, satisfies the inequality:

$$N > \log_2 \frac{f_s}{f_{ref}} \quad (5)$$

Instead of regarding, in Equation (5), the rate $f_{ref}$ as a parameter and the number of bits, N, as a variable, N can be considered as a parameter and the rate $f_{ref}$ as a variable. Thus, given an N-bit wide accumulator, $f_{ref}$ must be bounded as follows:

$$f_{ref} > \frac{f_s}{2^N} \quad (6)$$

which in an equality would be the minimum frequency that can be synthesized.

The aforenoted bounds on the width, N, of accumulator 301 and on the input clock rate, $f_{ref}$, ensure that the generated signal will have on the average the desired frequency within a ±50% margin of jitter. Since any transition of the VCO output can only occur at a transition of the $F_{ref}'$ clock, over any given dynamic range of frequencies, the upper bound, j, on the jitter, which is the maximal deviation in time between the VCO output and the ideal waveform operating at the same frequency, cannot be brought below the intrinsic limit $k/2^N$ which represents the quantum limitation of the accumulator-type VCO. Equivalently, for an a priori given upper-bound j on the jitter, the digital phase locked loop arrangement can only generate frequencies over the dynamic range defined by the inequality:

$$f_{VCO} < j f_s \quad (7)$$

Therefore, the stronger the requirement on the jitter, the lower the maximum frequency that can be generated by such an arrangement and at the same time satisfy a pre-imposed jitter limitation of 100×j%.

The expression for the lowest permissible constraint $j_{min}$ that can be imposed on the jitter can be derived with the help of equation (5), which ensures the existence of a VCO output with the desired average frequency $pf_{ref}$:

$$j > j_{min} \quad (8A)$$

$$j_{min} \approx \frac{f_s}{2^{N+1}} \cdot \frac{1}{f_{ref}} \quad (8B)$$

The lower bound on the frequencies $f_{VCO}$ that can be generated with less than 100×j% jitter is given therefore by:

$$f_{vco} > \frac{f_s}{j \, 2^{N+1}} \quad (9)$$

The combination of equations (8) and (9) shows that the VCO can generate signals over the dynamic range of frequencies $$\frac{f_s}{j \, 2^{N+1}} < f_{vco} < j f_s \quad (10)$$

with a jitter less than a pre-imposed limit j satisfying $j < j_{min}$.

As aforenoted, in order for the VCO to generate a signal that has the desired average frequency $pf_{ref}$, there must be p VCO output clock pulses between each $F_{ref}'$ pulse. As will be described hereinafter, frequency window comparator 208 (in FIG. 2) includes a down-counter and control logic that indicates that the frequency of the VCO is too fast when more than p pulses are counted and too slow when less than p pulses are counted between each $F_{ref}'$ pulse. Therefore the value in the down-counter just before an $F_{ref}'$ pulse is the number of overflows of accumulator latch 302 (in FIG. 3) during one period of the $F_{ref}'$ clock and the phase (modulo $2\pi$) of the VCO output signal is given by the value of the phase-register at this same time.

Only when the down-counter output is exactly equal to zero does the VCO have the correct average frequency, $pf_{ref}$. Determination of the jitter of this VCO output is obtained from the values of the phase-register at the $F_{ref}'$ pulse times. When the VCO output frequency is, on the average, equal to $pf_{ref}$, an upper estimation of the jitter is given by the absolute maximum deviation of the VCO output signal from an ideal waveform at that frequency with a high-to-low transition at each $F_{ref}'$ pulse, when phase-register/latch 302 is reset.

By constraining the phase-register/latch 302 to take pre-assigned values at each time it is reset, a VCO output is generated which satisfies pre-imposed requirements on the jitter. In particular, by examining only the n most significant bits of the phase-register/latch 302, and requiring these bits to all be equal, an upper bound of $j=1/2^n$ on the jitter will be achieved. When the n msb of the phase-register are all equal to ZERO, the value of the accumulator output is smaller than $2^{N-n}$ and corresponds to a maximal phase advance of $1/2^n$ fraction of a pulse. When the n msb of the phase-register are all equal to ONE, the value of the accumulator output is larger than $2^N-2^{N-n}$ and corresponds to a maximal phase delay of $1/2^n$ fraction of a pulse. As a result, when there are exactly p pulses of the VCO output signal during one period of the $F_{ref}'$ pulse signal, the jitter of the VCO output is ensured to be less than $1/2^n$ if the edge of the generated signal falls within the phase-window at each $F_{ref}'$ pulse.

Figure 5:
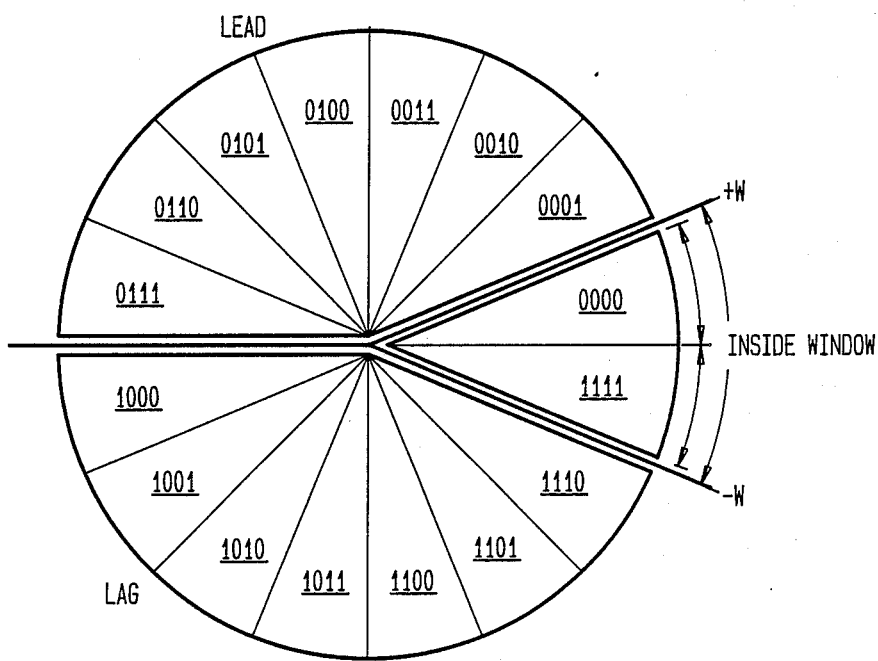
FIG. 5 shows the leading, lagging and acceptable phase windows for a particular numerical example.

With reference to FIG. 5, the phase-window in which the four msb of the VCO output are examined (n=4) is shown to lie between ±22.5 degrees, equivalent to a maximum jitter of $100/2^4$%, or 6.25%. In general, the phase window, w, is given by:

$$W = 1/2^n \times 360° \quad (11)$$

which is equivalent to a bounded jitter of:

$$100/2^n\% \quad (12)$$

As will be described hereinafter, when frequency comparator 208 (in FIG. 2) determines that the desired frequency $pf_{ref}'$, has been reached, phase comparator 210 determines from the n msb of phase-register/latch 302 (FIG. 3) in VCO 201 at each $F_{ref}'$ pulse instant, whether the phase of the VCO output is in the leading, lagging, or acceptable sectors of phase angles and "fine tunes" k until the phase of the VCO falls within the acceptable phase window, $(-W, +W)$.

Figure 6:
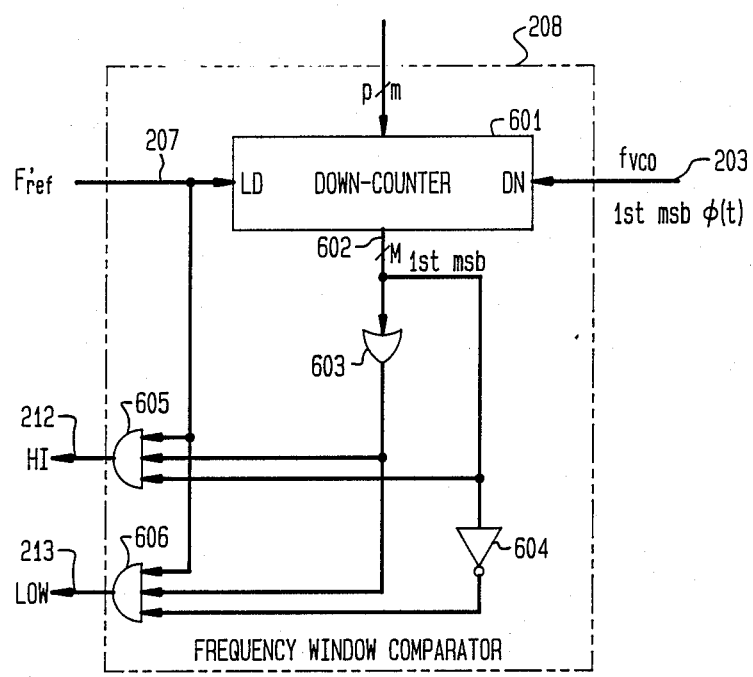
FIG. 6 is a diagram of the frequency window comparator incorporated within the phase locked loop of FIG. 2.

The logic circuitry of frequency window comparator 208 will be described with reference to FIG. 6. Frequency window comparator 208 includes a down-counter 601 which in response to the leading edge of each clock pulse at frequency $f_{VCO}$ pulse input at the down DN input, decreases its stored count by one. In response to each $F_{ref}'$ applied to the load LD input, the integer p, stored in p-register 211, is loaded into the counter. As aforenoted, if $f_{VCO}$ is at the correct frequency, $pf_{ref}$, then exactly p clock pulses will have been input to down-counter 601 before the next $F_{ref}'$ pulse resets the count to p. Thus the count of counter 601 just prior to the next $F_{ref}'$ pulse will be exactly zero. If, however, $f_{VCO}$ is too high, then more than p clock pulses will have been input to down-counter 601 and its count will be less than zero. On the other hand, if $f_{VCO}$ is too low, then fewer than p clock pulses will have been input to down-counter 601 and its count will be greater than zero.

The count of down-counter 601, represented in binary format on M output leads 602, is inputted to OR gate 603. The first most significant bit (msb) of the count, indicating the sign of the stored count, is inputted to inverter 604. The output of OR gate 603, the first msb output of down-counter 601, and the $F_{ref}'$ clock are gated through AND gate 605, while the output of OR gate 603, the output of inverter 604, and the $F_{ref}'$ clock are gated through AND gate 606. When at an $F_{ref}'$ pulse, the count in down-counter 601 is zero, then the output of OR gate 603 is a logical ZERO, which inhibits the $F_{ref}'$ pulse from being transferred to the outputs of either AND gates 605 or 606. When the cunt, however, is greater than zero, the output of OR gate 603 is a logical ONE, the first msb sign bit is ZERO, and the output of AND gate remains a logical ZERO. The $F_{ref}'$ pulse is, however, gated through AND gate 606, since its other two inputs are logical ONEs. Thus a pulse appears at the LOW output 213 of frequency window comparator 208, indicating that the frequency of the VCO is too low. As will be described, this pulse is input to k-controller 217 (in FIG. 2) which in response thereto adjusts the input k of the VCO so as to increase the frequency, $f_{VCO}$. Similarly, when at an $F_{ref}'$ pulse instant, the count of down-counter 601 is less than zero, the first msb sign bit is ONE and the $F_{ref}'$ pulse is gated through AND gate 605 to the HI output 212 of frequency window comparator 208 which causes k-controller 217 to adjust the value of k so as to decrease the frequency, $f_{VCO}$.

Figure 7:
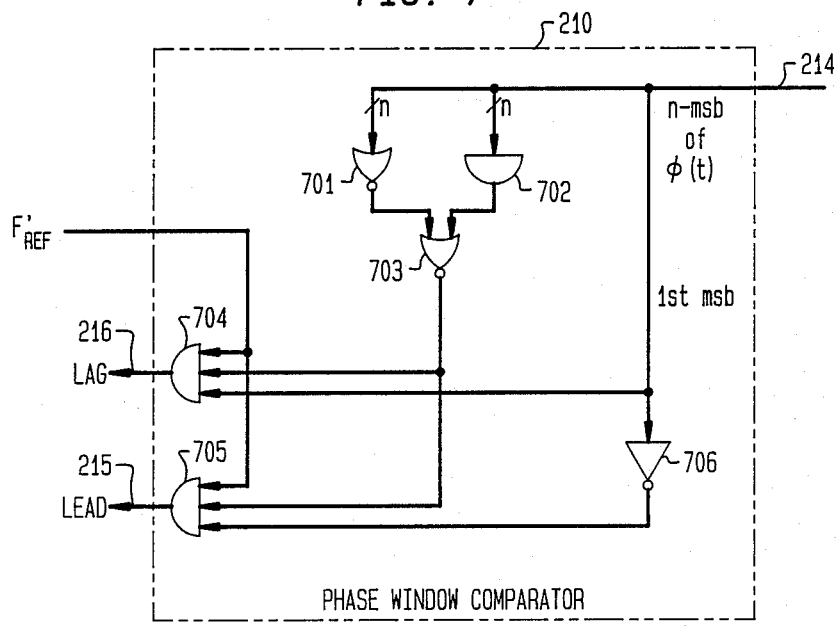
FIG. 7 is a diagram of the phase window comparator incorporated within the phase locked loop of FIG. 2.

The logic circuitry of phase window comparator 214 is illustrated in FIG. 7. As aforenoted, phase window comparator 214 examines the phase of the VCO 201 output at each $F_{ref}'$ pulse instant to determine whether the phase is within or without the prescribed phase window. As also aforenoted, only the n most significant bits (msb) of the N bits of $\phi(t)$ are employed to define the acceptable and unacceptable phase windows and to also bound the maximum jitter of the VCO output. As described, the phase of the VCO output is within an acceptable window when the n msb of $\phi(t)$ are either all ZEROes or all ONEs at each $F_{ref}'$ pulse instant. With reference to FIG. 7, the n msb of $\phi(t)$ are inputted to NOR gate 701 and AND gate 702. The outputs of gates 701 and 702 are both connected to NOR gate 703. The output of NOR gate 703 is connected to both AND gate 704 and AND gate 705. Also inputted to AND gate 704 is the $F_{ref}'$ clock, and the first msb of $\phi(t)$, indicative of the sign of $\phi(t)$. AND gate 705 also has the $F_{ref}'$ clock, as an input and the inverted, through inverter 706, first msb of $\phi(t)$.

When the n msb of $\phi(t)$ are either all ZERO or all ONE, indicating that the phase is within the acceptable window, the output of NOR gate 703 is a logical ZERO, which inhibits an $F_{ref}'$ pulse from being gated through either AND gate 704 or AND gate 705 to either LEAD output 215 or LAG output 216 of phase window comparator 210. When the phase is either leading or lagging, the output of NOR gate 703 is a logical ONE. When leading (see FIG. 5), the first msb of φ(t) is ZERO, and the logical ONE at the output of inverter 706 and the logical ONE at the output of NOR gate 703 enable the $F_{ref}'$ pulse to be gated to the output of AND gate 705 on LEAD output 215. Similarly, when the phase is lagging, the first msb of φ(t) is ONE, which when combined with the logical ONE at the output of NOR gate 703, permits an $F_{ref}'$ pulse to be gated to the output of AND gate 704 on LAG output 216. Accordingly, at each $F_{ref}'$ pulse instant, a pulse is gated to either the LEAD or LAG outputs 215 and 216 of phase window comparator 214 when the phase of the output of VCO 201, as quantized by the n msb, is leading or lagging, respectively. When, however, the quantized phase is within the prescribed window of acceptability, no pulse appears at either output.

Figure 8A:
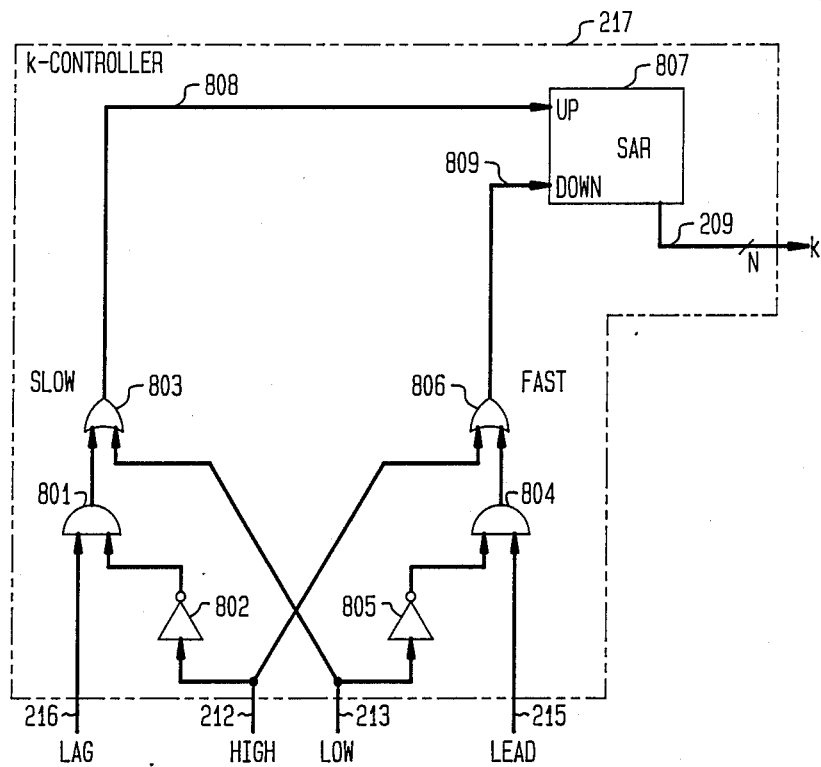
FIG. 8A is a diagram of the k-controller incorporated within the phase locked loop of FIG. 2.

The k-controller 217 is illustrated in FIG. 8A. The inputs to k-controller 217 are the HI/LOW outputs 212 and 213 of frequency window comparator 208 and the LEAD/LAG outputs 215 and 216 of phase window comparator 214. The LAG output 216 is connected to AND gate 801, together with the HI output 212, as inverted by inverter 802. The output of AND gate 801 and the LOW output are connected to OR gate 803. The lead output 215 is connected to AND gate 806 together with the LOW output 212, as inverted by inverter 805. The output of AND gate 804 and the HI output 212 are connected to OR gate 806.

When frequency window comparator 208 produces a pulse on its HI or LOW outputs 212 or 213, respectively, the pulse is gated through either OR gate 806 or OR gate 803 to the FAST or SLOW outputs 808 and 809, respectively, to indicate that the frequency $f_{VCO}$, of the VCO is too fast or too slow. The FAST output 809 is connected to the DOWN input of a successive approximation register (SAR) 807 which in response to such an input pulse, as will be described, reduces the value of k on its N output leads 209, which as aforedescribed, decreases the frequency, $f_{VCO}$. Similarly, the SLOW output 808 is connected to the UP input of SAR 807 which in response to such an input pulse thereon, increases the value of k, and increases the frequency, $f_{VCO}$.

At each $F_{ref}'$ pulse instant, k is adjusted up or down as long as a pulse appears on either the HI or LOW outputs 212 and 213 of frequency window comparator 208. A pulse on the HI output 212 inhibits, through inverter 802 and AND gate 801, a simultaneous pulse on the LAG output 216 of phase window comparator 214, from appearing at the UP input of SAR 807, while a pulse on the LOW output inhibits, through inverter 805 and AND gate 804, a simultaneous pulse on the LEAD output 215 from appearing at the DOWN input of SAR 807. Thus, a pulse on either the HI or LOW outputs 212 and 213 of frequency window comparator 208 dominates adjustment of SAR 807. When frequency lock is achieved and at an $F_{ref}'$ pulse instant, a pulse appears neither on the HI or LOW outputs 212 and 213, "fine tuning" of the phase is effected in response to the LEAD and LAG outputs 215 and 216 and of phase window comparator 214. Accordingly, a pulse on the LAG output is gated through AND gate 801 and OR gate 803 to the SLOW output 808 and thus the UP input of SAR 807 to increase the frequency $f_{VCO}$. Similarly, a pulse on the LEAD output is gated through AND gate 804 and OR gate 806 to the FAST output and thus the DOWN input of SAR 807 to decrease the frequency $f_{VCO}$.

Figure 8B:
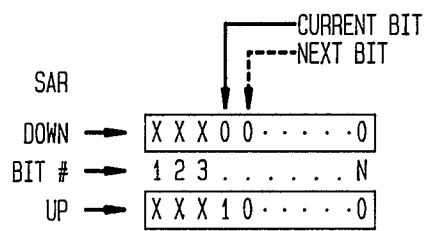
FIG. 8B shows the algorithm used to successively adjust the register of the successive approximation register incorporated in the k-controller of FIG. 8A.

SAR 807 is a standard well known circuit which successively adjusts its register, one bit at a time, in response to each pulse at its UP or DOWN inputs. In particular, SAR 807 employs an algorithm illustrated in FIG. 8B as it varies its output k, as stored in its register, for frequency and phase lock. If a pulse appears at the DOWN input, indicating that $f_{VCO}$, and thus k, is too high, the current bit is forced to ZERO and all lower bits in the register are forced ZERO, as the SAR steps to the next adjacent lower bit position. Alternatively, if a pulse appears at the UP input, indicating that $f_{VCO}$, and thus k, is too low, the current bit is forced ONE and all lower bits are again forced ZERO, as the SAR steps to the next adjacent lower bit position. When the final bit of the SAR is set, the SAR moves to the first msb of the register and continues setting each bit until no pulses occur at either the UP or DOWN inputs. Assuming no external variations in the frequency $f_{ref}$, lock will be achieved in less than or equal to N steps through SAR 807.

As a numerical example, a phase locked loop using the present invention can be implemented to generate any signal from 10 Hz to 1.5625 Mhz using a 24-bit accumulator (N=24) and a system clock, $f_s$, of 25 Mhz. By selecting the n=4 msb of the VCO output for the phase window comparator, the jitter is bounded to be within 6.25%.

Although described hereinabove in conjunction with a digital voltage controlled oscillator in a digital phase locked loop, the principles of the present invention could be readily employed using an analog VCO in an analog or digital phase locked loop.

The above-described embodiment is illustrative of the principles of the present invention. Other embodiments could be devised by those skilled in the art without departing from the spirit and scope of the present invention.

What is claimed is:

1. A phase locked loop for generating an output clock signal having a frequency equal to an integer multiple of the frequency of an input clock signal comprising:
   a voltage controlled oscillator (VCO) for generating the output clock signal at a frequency determined by a control signal;
   frequency window comparison means for comparing in response to input clock signal pulses the frequency of the output signal with the integer multiple of the input clock signal frequency and for generating an output that indicates whether the output clock signal frequency is higher, lower or equal to the integer multiple of the frequency of the input clock signal;
   phase window comparison means for comparing in response to input clock signal pulses the phase angle of the output clock signal relative to a predetermined reference angle and for generating an output that indicates whether the phase angle of the output clock signal relative to the reference angle is leading, lagging or within a predetermined window of acceptability;
   means for setting the phase difference between the output clock signal and the input clock signal to zero degrees in response to input clock pulses following each phase comparison; and
   control means for varying said control signal only when the output of said frequency window comparison means indicates that the output clock signal frequency is higher or lower than the integer multiple of the input clock signal frequency, or the output of said phase window comparison means indicates that the phase of the output clock signal is leading or lagging, and for maintaining said control signal when the output of said frequency window comparison means indicates that the output clock signal frequency is equal to the integer multiple of the input clock signal frequency and the output of said phase window comparison means indicates that the phase of the output clock is within said predetermined window of acceptability;

wherein the jitter of the output clock signal is bounded within a value determined by said predetermined window of acceptability.

2. A phase locked loop in accordance with claim 1 wherein said VCO is a digital VCO.

3. A phase locked loop in accordance with claim 2 wherein said digital VCO is an accumulator-type VCO, the frequency of which is determined by the value of a variable digital input.

4. A phase locked loop in accordance with claim 3 wherein said control means comprises means for varying the value of said digital input to said accumulator-type VCO up and down or maintaining its value in accordance with the outputs of said frequency window comparison means and said phase window comparison means.

5. A phase locked loop in accordance with claim 4 wherein said means for varying the value of said digital input to said VCO comprises means for determining from the outputs of said frequency window comparison means and said phase window comparison means whether the frequency of said VCO should be increased, decreased or held constant, and a successive approximation register responsive to said determining means for increasing, decreasing and maintaining constant the value of said digital input to said VCO.

6. A phase locked loop in accordance with claim 2 further comprising:

storage means for storing said integer multiple; and wherein said frequency window comparison means comprises means for counting the number of output clock pulses between each input clock pulse, and means for indicating that the frequency of the output clock signal is too high when more than the stored integer multiple of pulses is counted, and means for indicating that the frequency of the output clock signal is too low when less than that stored number of pulses is counted.

7. A phase locked loop in accordance with claim 2 wherein the phase of the output clock signal is digitally represented by an N bit digital word, and said phase window comparison means is responsive to only the n most significant bits of said N bit digital word, said phase window comparison means comprising means for determining and indicating that the phase of the output clock signal is within the window of acceptability when the said n bits are either all "1" or all "0", is lagging when the sign bit of the n bits indicates a negative phase, and is leading when the sign bit indicates a positive phase.

8. In a phase locked loop which generates an output clock signal having a frequency equal to an integer multiple to the frequency of an input clock signal, circuitry for maintaining the jitter of the output clock signal within bounded limits comprising:

frequency window comparison means for comparing in response to input clock signal pulses the frequency of the output clock signal with the integer multiple of the input clock signal frequency and for generating an output that indicates whether the output clock signal frequency is higher, lower or equal to the integer multiple of the frequency of the input clock signal;

phase window comparison means for comparing in response to input clock signal pulses the phase angle of the output clock signal relative to a predetermined reference angle and for generating an output that indicates whether the phase angle of the output clock signal relative to the predetermined reference angle is leading, lagging, or within a predetermined window of acceptability, the limits of said window being determined by the bounded limits of the jitter;

means for setting the phase difference between the output clock signal and the input clock signal to zero degrees in response to input clock pulses following each phase comparison; and means for adjussting the frequency of the output clock signal only when the output of the frequency window comparison means indicates that the output frequency is higher or lower than the integer multiple of the input clock signal frequency, or the output of said phase window comparison means indicates that the phase of the output clock signal is leading or lagging, and for maintaining said control signal when the output of said frequency window comparison means indicates that the output clock signal frequency is equal to the integer multiple of the input clock signal frequency and the output of said phase window comparison means indicates that the phase of the output clock is within said predetermined window of acceptability.

9. The circuitry in accordance with claim 8 wherein said frequency window comparison means comprises means for counting the number of output clock pulses between input clock pulses, and means for indicating that the frequency of the output clock is too high or too low when other than said integer multiple number of pulses is counted.

10. The circuitry in accordance with claim 8 wherein the phase of the output clock signal is digitally represented by an N bit digital word, and said phase comparison means is responsive to only the n most significant bits of said N bit digital word, said phase window comparison means comprising means for determining and indicating that the phase of the output clock signal is within the window of acceptability when the said n bits are either all "1" or all "0", is lagging when the sign bit of the n bits indicates a negative phase, and is leading when the sign bit indicates a positive phase, the bounded limits of the allowable jitter being determined as a function of n.

11. A digital phase locked loop for generating an output clock signal having a frequency equal to an integer p times the frequency of an input clock signal comprising:

a digital voltage controlled oscillator (VCO) for generating from a high-speed system clock the output clock signal at a frequency determined by a digital input control signal to said VCO;

frequency window comparison means for comparing in response to input clock signal pulses the frequency of the output clock signal with p times the frequency of the input clock signal and for generating an output that indicates whether the frequency of the output clock signal is higher, lower or equal to p times the frequency of the input clock signal;

phase window comparison means for comparing in response to input clock signal pulses the phase angle of the output clock signal relative to a predetermined reference angle and for generating an output that indicates whether the phase of the output clock signal relative to the reference angle is leading, lagging or within a predetermined window of acceptability;

means for setting the phase difference between the output clock signal and the input clock signal to zero degrees in response to input clock pulses following each phase comparison; and control means for varying the digital input control signal only when the output of said frequency window comparison means indicates that the output clock signal frequency is higher or lower than p times the input clock signal frequency, or the output of said phase window comparison means indicates that the phase of the output clock signal is leading or lagging, and for maintaining said control signal when the output of said frequency window comparison means indicates that the output clock signal frequency is equal to p times the input clock signal frequency and the output of said phase window comparison means indicates that the phase of the output clock is within said predetermined window of acceptability;

wherein the jitter of the output clock signal is bounded within a value determined by said predetermined window of acceptability.

12. A digital phase locked loop in accordance with claim 11 wherein said digital VCO is an accumulator-type VCO which comprises a digital adding means and an N bit latch connected to the output of said adding means, the frequency of said output clock signal being determined by the value k of the digital input signal to said digital adding means of said VCO.

13. A phase locked loop in accordance with claim 12 wherein said control means comprises means for adjusting k up and down or maintaining its value in response to the outputs of said frequency window comparison means and said phase window comparison means.

14. A phase locked loop in accordance with claim 13 wherein said means for adjusting k comprises a successive approximation register for storing k and which is responsive to inputs to increase or decrease k, and means for generating said inputs to said successive approximation register from the outputs from said frequency window comparison means and said phase window comparison means.

15. A phase locked loop in accordance with claim 14 further comprising register means for storing the integer p, and the phase of said output clock signal is represented by the contents of said N bit latch, and the output clock signal is represented by the time varying contents of the first most significant bit of said N bit latch.

16. A phase locked loop in accordance with claim 15 wherein said frequency window comparison means comprises down-counting means which in response to each input clock pulse loads p from said register means, and in response to each output clock pulse, decreases its count by one, the contents of said down-counting means prior to being loaded with p being indicative of whether the frequency of said output clock signal is too high, too low or equal to p times the frequency of the input clock signal.

17. A phase locked loop in accordance with claim 15 wherein said phase window comparison means is responsive to only the first n most significant bits in said N bit latch, said phase window comparison means comprising means for determining and indicating that the phase is within the window of acceptability when the said n bits are either all "1" or all "0", is lagging when a sign bit of the n bits indicates a negative phase, and is leading when the sign bit indicates a positive phase.

* * * * *

UNITED STATES PATENT AND TRADEMARK OFFICE
CERTIFICATE OF CORRECTION

PATENT NO. : 4,855,683

DATED : August 8, 1989

INVENTOR(S) : Thierry Troudet, Stephen M. Walters

It is certified that error appears in the above-identified patent and that said Letters Patent is hereby corrected as shown below:

Column 6, line 64, change "< " to -->--.
Column 8, line 22, change "cunt" to --count--.
Column 9, line 27, change "212" to --213--.
Column 12, line 23, change "adjussting" to --adjusting--.

Signed and Sealed this

Twenty-seventh Day of November, 1990

Attest:

HARRY F. MANBECK, JR.

*Attesting Officer*  *Commissioner of Patents and Trademarks*